(12) United States Patent
Ukigaya

(10) Patent No.: US 11,742,372 B2
(45) Date of Patent: Aug. 29, 2023

(54) SEMICONDUCTOR DEVICE AND METHOD FOR MANUFACTURING SEMICONDUCTOR DEVICE

(71) Applicant: CANON KABUSHIKI KAISHA, Tokyo (JP)

(72) Inventor: Nobutaka Ukigaya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 4 days.

(21) Appl. No.: 17/367,033

(22) Filed: Jul. 2, 2021

(65) Prior Publication Data

US 2021/0335863 A1 Oct. 28, 2021

Related U.S. Application Data

(63) Continuation of application No. 15/413,711, filed on Jan. 24, 2017, now Pat. No. 11,069,732.

(30) Foreign Application Priority Data

Jan. 26, 2016 (JP) ................... 2016-012868

(51) Int. Cl.
*H01L 27/146* (2006.01)

(52) U.S. Cl.
CPC ...... *H01L 27/1463* (2013.01); *H01L 27/1464* (2013.01); *H01L 27/14621* (2013.01); *H01L 27/14623* (2013.01); *H01L 27/14627* (2013.01); *H01L 27/14636* (2013.01); *H01L 27/14645* (2013.01); *H01L 27/14687* (2013.01)

(58) Field of Classification Search
CPC ........... H01L 27/14636; H01L 27/1464; H01L 27/14689; H01L 2221/1047; H01L 2221/1042; H01L 27/14612; H01L 27/1463; H01L 27/76898; H01L 27/14621; H01L 27/14623; H01L 27/14627; H01L 27/14645; H01L 27/14687; H01L 21/768; H01L 21/76898; H01L 23/481
See application file for complete search history.

(56) References Cited

U.S. PATENT DOCUMENTS

| 8,884,319 B2 * | 11/2014 | Kunikiyo | ............ H01L 27/1463 257/93 |
| 9,379,043 B1 * | 6/2016 | Wang | ..................... H01L 23/481 |
| 2012/0248580 A1 * | 10/2012 | Matsugai | ............ H01L 25/0657 257/621 |

(Continued)

*Primary Examiner* — Shahed Ahmed
*Assistant Examiner* — Khatib A Rahman
(74) *Attorney, Agent, or Firm* — Canon U.S.A., Inc., IP Division

(57) ABSTRACT

A semiconductor device includes a semiconductor layer having a front surface on which a transistor is provided and a back surface opposite to the front surface, and a conductive member that penetrates through the semiconductor layer. In the semiconductor device, between a second plane including the back surface and a third plane, a solid material that is an insulator is provided between the conductive member and the semiconductor layer, and, between a first plane including the front surface and the third plane, a hollow part is provided between the conductive member and the semiconductor layer, and a center of the hollow part in a direction crossing the first plane and the second plane is positioned between the first plane and the third plane.

24 Claims, 6 Drawing Sheets

(56) References Cited

U.S. PATENT DOCUMENTS

| | | | |
|---|---|---|---|
| 2013/0323875 A1* | 12/2013 | Park | H01L 27/1463 438/70 |
| 2014/0002700 A1* | 1/2014 | Oishi | H01L 27/14627 348/273 |
| 2014/0054662 A1* | 2/2014 | Yanagita | H01L 27/1463 257/291 |
| 2015/0008555 A1* | 1/2015 | Mizuta | H01L 27/1469 257/432 |
| 2015/0263054 A1* | 9/2015 | Chien | H01L 27/1464 257/292 |
| 2015/0372031 A1* | 12/2015 | Yoon, | H01L 27/14689 257/446 |
| 2016/0163749 A1* | 6/2016 | Yang | H01L 21/76227 257/446 |
| 2016/0204143 A1* | 7/2016 | Lee | H01L 27/1464 257/229 |
| 2018/0269237 A1* | 9/2018 | Cheng | H01L 27/14689 |
| 2018/0294300 A1* | 10/2018 | Ishida | H01L 27/1464 |

* cited by examiner

SEMICONDUCTOR DEVICE AND METHOD FOR MANUFACTURING SEMICONDUCTOR DEVICE

CROSS-REFERENCE TO RELATED APPLICATIONS

This application is a continuation of U.S. patent application Ser. No. 15/413,711, filed Jan. 24, 2017, which claims the benefit of Japanese Patent Application No. 2016-012868, filed Jan. 26, 2016, each of which is hereby incorporated by reference herein in their entirety.

BACKGROUND OF THE INVENTION

Field of the Invention

Aspects of the present invention relate to an isolation structure of a semiconductor device.

Description of the Related Art

In a semiconductor device, by providing a hollow part in each of an isolation structure between semiconductor elements and an isolation structure between a semiconductor and a conductor, an effect of reducing influences of stress generated around the isolation structure is expected.

Japanese Patent Laid-Open No. 2015-29047 describes that an inside of an opening of a pad surrounding guard ring is filled with air.

Japanese Patent Laid-Open No. 2014-204047 describes that element isolation for isolating elements is formed by an insulator and a space.

SUMMARY OF THE INVENTION

A first aspect of the present disclosure provides a semiconductor device including, a semiconductor layer having a front surface on which a transistor is provided and a back surface opposite to the front surface; and a conductive member that penetrates through the semiconductor layer. In the first aspect of the present disclosure, a virtual plane that includes the front surface and extends along the front surface is set as a first plane, a virtual plane that includes the back surface and extends along the back surface is set as a second plane, and a virtual plane that is positioned at an equal distance from the first plane and the second plane is set as a third pane. In the first aspect of the present disclosure, between the second plane and the third plane, a solid material that is an insulator is provided between the conductive member and the semiconductor layer, between the first plane and the third plane, a hollow part is provided between the conductive member and the semiconductor layer, and a center of the hollow part in a direction crossing the first plane and the second plane is positioned between the first plane and the third plane.

A second aspect of the present disclosure provides a semiconductor device including a semiconductor layer that has a front surface on which a transistor is provided and a back surface opposite to the front surface. In the second aspect of the present disclosure, a virtual plane that includes the front surface and extends along the front surface is set as a first plane, a virtual plane that includes the back surface and extends along the back surface is set as a second plane, and a virtual plane that is positioned at an equal distance from the first plane and the second plane is set as a third pane. In the second aspect of the present disclosure, a trench penetrating through the third plane is provided in the semiconductor layer, a hollow part and a solid material are provided in the trench, and a center of the hollow part in a direction crossing the first plane and the second plane is positioned between the first plane and the third plane.

A third aspect of the present disclosure provides a method for manufacturing a semiconductor device, including the steps of: forming, from a front surface side of a semiconductor substrate having a front surface, a trench in the semiconductor substrate; forming a solid material, which is an insulator, in the trench; and thinning the semiconductor substrate from a side opposite to the front surface. In the third aspect of the present disclosure, the step of forming the solid material is performed so that a hollow part is formed in the trench, and a distance between a center of the hollow part and a bottom of the trench in a depth direction of the trench is greater than a half of a depth of the trench.

Further features of the present invention will become apparent from the following description of exemplary embodiments with reference to the attached drawings.

DESCRIPTION OF THE EMBODIMENTS

Figure 1A:
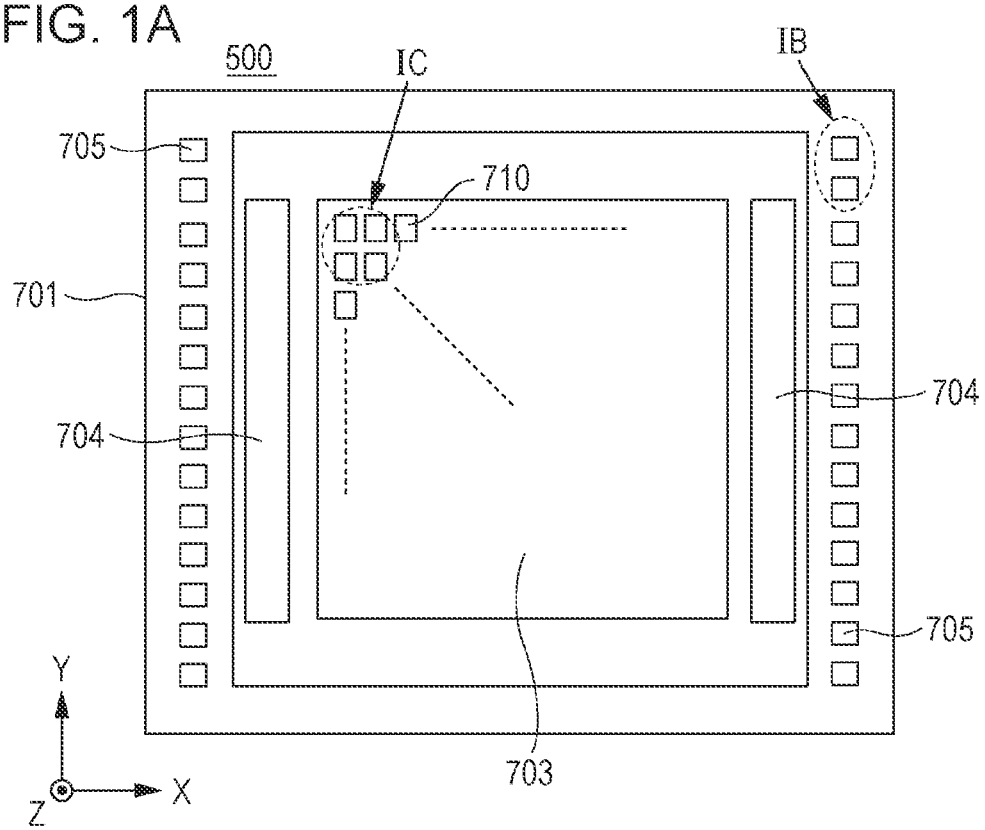
FIGS. 1A to 1C are schematic views for explaining an example of a semiconductor device.

The reliability of a semiconductor device may be reduced depending on a position of a hollow part in a conventional technique. Thus, the present embodiment improves the reliability of the semiconductor device. An exemplary embodiment of the invention will be described below with reference to the drawings. Note that, in the description and drawings given below, configurations common in a plurality of drawings are denoted by common reference numerals. The common configuration will be described with reference to the plurality of drawings and the descriptions of the configurations denoted by the common reference numerals are omitted as appropriate.

According to the exemplary embodiment described below, a semiconductor device having high reliability is able to be provided.

According to the present exemplary embodiment described below, a method for manufacturing the semiconductor device having high reliability is able to be provided.

Figure 1B:
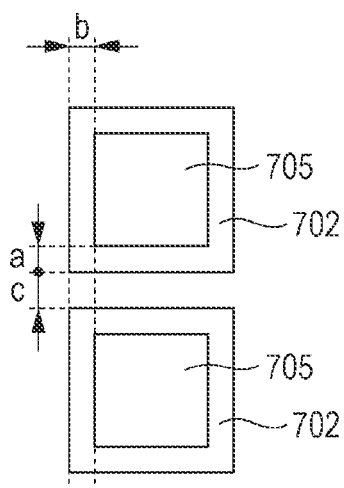
Figure 1C:
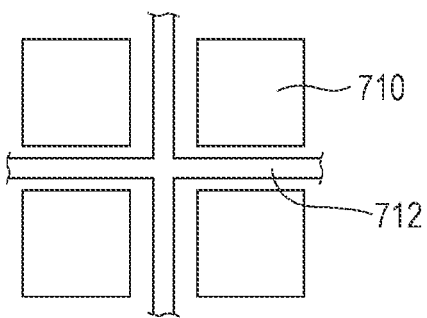

FIGS. 1A to 1C are schematic plan views illustrating a semiconductor device 500 of the present exemplary embodiment. The semiconductor device 500 includes a semiconductor chip 701 and may include a package, in which the semiconductor chip 701 is stored, as necessary. A Chip Size Package (CSP) may be used by bonding a glass substrate or the like to a semiconductor chip. The semiconductor device 500 may have a configuration in which a plurality of semiconductor chips are laminated.

FIGS. 1A to 1C are schematic cross-sectional views illustrating the semiconductor device 500 of the present exemplary embodiment. The semiconductor device 500 of the present example is an image capturing device and is a backside illumination CMOS image sensor.

As illustrated in FIG. 1A, a pixel circuit unit 703 and a peripheral circuit unit 704 are arranged in the semiconductor chip 701. Pixel circuits each of which includes a photoelectric conversion unit 710 are arranged in the pixel circuit unit 703. The peripheral circuit unit 704 is provided with a driving circuit that drives each of the pixel circuits, an analog signal processing circuit and a digital signal processing circuit that process a signal from the pixel circuit, a control circuit that controls other circuits, and the like.

The semiconductor chip 701 has an interconnect structure, and the interconnect structure is desired to be a multilayer interconnect structure including a plurality of interconnect layers. The semiconductor chip 701 also includes connection units 705 to exchange a signal between the semiconductor chip 701 and the outside. An electrode pad of each of the connection units 705 may include an input pad and an output pad that exchange a signal with an external circuit. The connection units 705 of the semiconductor chip 701 are arranged in a peripheral region in the semiconductor chip 701.

FIG. 1B is an enlarged view of a part IB surrounded by the dotted line, which is indicated in a region where the connection units 705 are arranged in FIG. 1A. As illustrated in FIG. 1B, an isolation structure 702 is provided around each of the connection units 705. With such an isolation structure 702, a conducive member forming the connection unit 705 and a semiconductor layer of the semiconductor chip 701 are insulated. Note that, a hollow part is provided in the isolation structure 702 as described below. The hollow part can be reworded as a void. This hollow part functions to reduce stress by a thermal expansion coefficient difference between the conductive member and its surrounding material, for example, silicon. Thus, it is desired that the isolation structure 702 having the hollow part is arranged in a place where the stress needs to be reduced, for example, between the adjacent connection units 705 in accordance with a pattern layout. Widths a and b of the isolation structure 702 may be different so that the hollow part is formed easily. For example, the width a of the insulating isolation portion between the adjacent connection units 705 is able to be made wider.

FIG. 1C is an enlarged view of a part IC that surrounds a region where the photoelectric conversion units 710 of the pixel circuit unit 703 are arranged in an array in FIG. 1A. As illustrated in FIG. 1C, an isolation structure 712 having a trench structure is provided around each of the photoelectric conversion units 710. This isolation structure 712 is able to electrically and/or optically isolate the photoelectric conversion units 710. Note that, a hollow part is provided in the isolation structure 712 as described below. The hollow part can be reworded as a void. This hollow part functions to reduce stress by a thermal expansion coefficient difference between the conductive member and its surrounding material, for example, silicon.

A solid material 203 is provided in a grid shape around pixels each of which includes the photoelectric conversion unit. Alternatively, when one pixel has a plurality of photoelectric conversion units, the solid material 203 may be provided around each of the photoelectric conversion units.

The semiconductor device 500 includes a semiconductor layer 102. The semiconductor layer 102 is, for example, a silicon layer. The semiconductor layer 102 has a front surface 10 and a back surface 20.

The photoelectric conversion unit 710 of the pixel circuit unit 703 is, for example, a photodiode having an N-type semiconductor region 107 and a P-type semiconductor region 108 around the N-type semiconductor region 107, which are arranged in the semiconductor layer 102. Note that, a part of the P-type semiconductor region 108 may be set to have an impurity concentration that suppresses dark current at an interface between the semiconductor layer 102 and an insulator.

Transistors are formed on the front surface 10 of the semiconductor layer 102. For example, pixel transistors Tr1 and Tr2 are arranged in the pixel circuit unit 703. Peripheral transistors Tr3 and Tr4 are formed in the peripheral circuit unit 704. In the present example, the pixel transistors Tr1 and Tr2 and the peripheral transistors Tr3 and Tr4 are insulated-gate field-effect transistors (MOSFETs). For example, the peripheral transistor Tr3 has a gate electrode 105 and a source/drain region 106. The source/drain region 106 is a semiconductor region serving as at least one of a source and a drain. There may be a semiconductor region that serves as a source or a drain depending on an operation. The transistors arranged on the front surface 10 of the semiconductor layer 102 are not limited to the insulated-gate field-effect transistors and may be bipolar transistors or joint field-effect transistors.

The plurality of transistors are isolated by element isolation units 104. Each of the element isolation units 104 has a LOCOS structure or a STI structure. A logic circuit formed in the peripheral circuit unit 704 is able to be constituted by a CMOS circuit. Note that, the front surface 10 of the semiconductor layer 102 may have concave and convex corresponding to the element isolation units 104. An interface between the front surface 10 and a gate insulating film of each of the transistors is able to be regarded as a representative part of the front surface 10.

An interconnect structure 150 is provided on the front surface 10 of the semiconductor layer 102. The interconnect structure 150 includes a plurality of interconnect layers 110, 112, and 114 and plugs 109, 111, and 113 for connecting the interconnect layers 110, 112, and 114 with the semiconductor layer 102. The interconnect structure 150 includes an insulating film 117 provided around the interconnect layers 110, 112, and 114 and the plugs 109, 111, and 113. The insulating film 117 is a multilayer film including an interlayer insulating layer, a diffusion preventing layer, and a passivation layer. A material of the interconnect layers 110, 112, and 114 is copper or aluminum. A material of the plugs 109, 111, and 113 is copper or tungsten. A material of the insulating film 117 is silicon oxide, silicon nitride, silicon carbide, or the like. Note that, silicon oxynitride and silicon carbonitride are regarded as a kind of silicon oxide, silicon nitride, or silicon carbide. When a thickness of the semiconductor layer 102 is small (for example, equal to or less than 100 μm), the semiconductor layer 102 is supported by a supporting substrate 800 whose thickness is greater than that of the semiconductor layer 102.

A light shielding layer 303 corresponding to a region that should be blocked from light is arranged on the back surface 20 side of the semiconductor layer 102 through an insulating layer 302. The light shielding layer 303 is electrically connected to the semiconductor layer 102, and an insulating layer 312 is laminated on the light shielding layer 303 that is fixed to a predetermined electric potential. A planarized layer 304 is provided on the insulating layer 312. A color filter array 305, for example, in red, green, and blue is arranged on the planarized layer 304 correspondingly to pixels, and a lens array 306 is arranged on the color filter array 305.

A conductive member 310 that penetrates through the semiconductor layer 102 and reaches the interconnect layer 110 is provided in the connection unit 705. The conductive member 310 of the present example is a so-called Through-Silicon Via (TSV). The conductive member 310 extends along a side surface 120 of the semiconductor layer 102. The side surface 120 connects the front surface 10 and the back surface 20. The conductive member 310 is connected to a pad electrode 311. The typical pad electrode 311 includes an aluminum layer, and is able to include a titanium layer and a titanium nitride layer as necessary. The interconnect layer 110 and the pad electrode 311 are connected through the conductive member 310. An opening 313 is provided on the pad electrode 311. The pad electrode 311 is connected to a conductive wire used for wire bonding, a conductive bump used for flip chip bonding, or the like via the opening 313. In the semiconductor device 500, supplying of a power source, and inputting or outputting of a signal are performed through the pad electrode 311. Though the conductive member 310 is a connection member that connects the interconnect layer 110 and the pad electrode 311, the conductive member 310 is not limited to such a connection member. For example, the conductive member 310 may be a connection member which, in a semiconductor device in which a plurality of chips are laminated, connects an interconnect layer of one chip and an interconnect layer of the other chip. The conductive member 310 may be also a connection member that connects an interconnect layer of one chip and a pad electrode of the other chip. Further, the conductive member 310 may be a partition member for suppressing entry of moisture and the like from the outside.

A solid material 103 that is an insulator is provided between the conductive member 310 and the semiconductor layer 102. The solid material 103 may contact both of the conductive member 310 and the side surface 120 of the semiconductor layer 102. A hollow part 130 is also provided between the conductive member 310 and the semiconductor layer 102. The solid material 103 and the hollow part 130 form the aforementioned isolation structure 702. The solid material 103 forms an interface with the hollow part 130. In the present example, the solid material 103 surrounds the hollow part 130. A state where the solid material 103 surrounds the hollow part 130 is provided when an entire interface between the hollow part 130 and a member around the hollow part 130 is formed by the solid material 103 and the hollow part 130. A state where the hollow part 130 forms the interface not only with the solid material 103 but also with the semiconductor layer 102 and the conductive member 310 is not regarded as the surrounding state.

With the solid material 103 that is the insulator, the conductive member 310 and the semiconductor layer 102 (silicon layer) are able to be insulated. As the solid material 103, a silicon compound such as silicon oxide, silicon nitride, or silicon carbide is able to be used. The hollow part 130 is a space having gas such as air or inert gas or a vacuum space.

In the pixel circuit unit 703, a trench 220 is provided in the semiconductor layer 102. The solid material 203 and a hollow part 230 are provided in the trench 220. The solid material 203 and the hollow part 230 form the aforementioned isolation structure 712. The solid material 203 may be a conductor, a semiconductor, or a complex compound including a plurality of them. As the conductor, multicrystalline silicon, metal, or a metal compound is able to be used. As the semiconductor, a single crystalline semiconductor or an amorphous semiconductor that is formed through epitaxial growth is able to be used. As the insulator, a silicon compound such as silicon oxide, silicon nitride, or silicon carbide is able to be used. As the complex compound, for example, an insulating layer arranged along the trench 220 and a conductive layer buried inside the insulating layer are able to be used.

The present exemplary embodiment is characterized by a position of the hollow part 130 in the isolation structure 702 and a position of the hollow part 230 in the isolation structure 712. The positions of the hollow parts 130 and 230 will be described in detail below. Note that, in the semiconductor device 500, it is only required that at least one of the isolation structures 702 and 712 is provided and the other is able to be omitted.

Figure 3A:
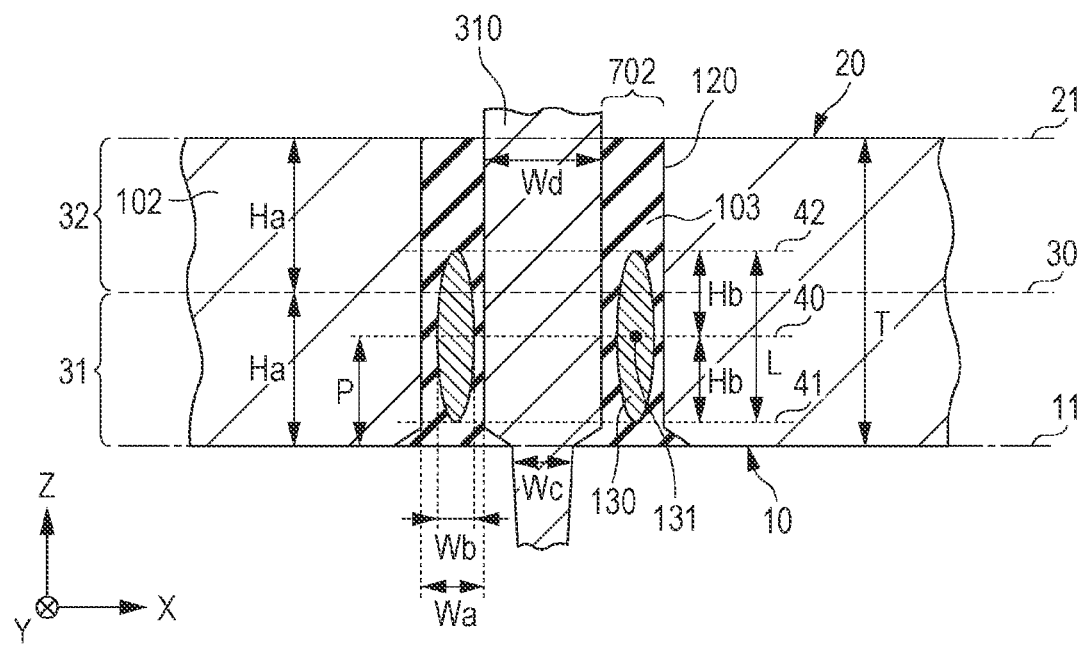
FIGS. 3A and 3B are schematic views for explaining an example of the semiconductor device.
Figure 3B:
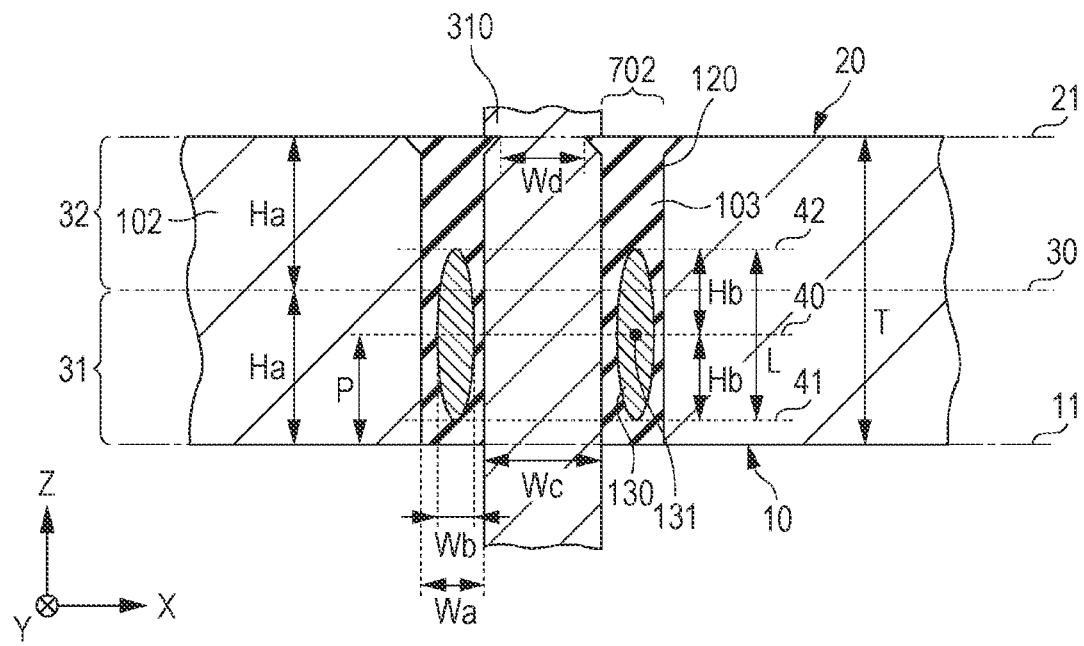

The position of the hollow part 130 in the isolation structure 702 will be described with reference to FIGS. 3A and 3B. FIG. 3A illustrates a first example of the isolation structure 702 and FIG. 3B illustrates a second example of the isolation structure 702.

A thickness of the semiconductor layer 102 is denoted by T. The thickness T is about 1 to 1000 μm. The present exemplary embodiment is suitable when the thickness T is 1 to 250 μm, and the thickness T in the present example is set in a range of 2 to 10 μm.

A virtual plane that includes the front surface 10 of the semiconductor layer 102 and extends along the front surface 10 is set as a first plane 11. A virtual plane that includes the back surface 20 of the semiconductor layer 102 and extends along the back surface 20 is set as a second plane 21. The first plane 11 is able to be set so as to include a representative part of the front surface 10, which forms an interface with the gate insulating film. A virtual plane that is positioned at an equal distance Ha from the first plane 11 and the second plane 21 is set as an intermediate plane 30 (third plane). The distance Ha corresponds to a half of the thickness T (Ha=T/2). A region between the first plane 11 and the intermediate plane 30 is referred to as a front-side region 31 and a region between the second plane 21 and the intermediate plane 30 is referred to as a back-side region 32. A direction along the first plane 11 and the second plane 21 is referred to as an in-plane direction X, and a direction crossing (typically, orthogonal to) the first plane 11 and the second plane 21 is referred to as a thickness direction Z.

Not only the semiconductor layer 102 but also the conductive member 310, the solid material 103, and the hollow part 130 are positioned between the first plane 11 and the second plane 21.

The solid material 103 that is the insulator is provided at least between the second plane 21 and the intermediate plane 30, that is, in the back-side region 32. In the back-side region 32, the solid material 103 is provided between the conductive member 310 and the semiconductor layer 102. In the present example, a part of the solid material 103 is provided also between the first plane 11 and the intermediate plane 30, that is, in the front-side region 31. The solid material 103 is provided to extend from the back-side region 32 to the front-side region 31 along the side surface 120 of the semiconductor layer 102. The solid material 103 may be provided only between the second plane 21 and the third plane 30.

The hollow part 130 is provided at least between the first plane 11 and the intermediate plane 30, that is, in the front-side region 31. In the present example, a part of the hollow part 130 is provided also between the second plane 21 and the intermediate plane 30, that is, in the back-side region 32. The hollow part 130 may be provided only between the first plane 11 and the third plane 30. The hollow part 130 is provided to extend from the front-side region 31 to the back-side region 32 along the side surface 120 of the semiconductor layer 102.

A center 131 of the hollow part 130 in the thickness direction Z is positioned between the first plane 11 and the intermediate plane 30, that is, in the front-side region 31. The center 131 of the hollow part 130 is at a position 40 at an equal distance Hb from a position 41 of an end of the hollow part 130 on the first plane 11 side and a position 42 of an end of the hollow part 130 on the second plane 21 side. The distance Hb corresponds to a half of a length L of the hollow part 130 in the thickness direction Z (Hb=L/2). A distance P between the center 131 and the first plane 11 is shorter than the distance Ha (Ha>P). The distance P is desired to be longer than the distance Hb (P>Hb). When the hollow part 130 penetrates through the first plane 11 and extends to the side opposite to the semiconductor layer 102 with respect to the first plane 11, the distance P may be shorter than the distance Hb. In both of the examples of FIGS. 3A and 3B, the distance between the second plane 21 and the position 42 of the end of the hollow part 130 on the second plane 21 side is longer than the distance between the first plane 11 and the position 41 of the end of the hollow part 130 on the first plane 11 side.

A distance Wa between the conductive member 310 and the semiconductor layer 102 in the in-plane direction X is desired to be greater than a width Wb of the hollow part 130 in the in-plane direction X. When the hollow part 130 is surrounded by the solid material 103, the width Wb of the hollow part 130 may be smaller than the distance Wa. For enhancing stress-relaxing properties, it is desired that the width Wb of the hollow part 130 is as wide as possible and the width Wb is greater than a half of the distance Wa (Wb>Wa/2).

A difference between the first example (FIG. 3A) and the second example (FIG. 3B) lies in that a relation of a width of the isolation structure 702 and a width of the conductive member 310 in the in-plane direction X is different in the thickness direction Z.

In the first example, the width of the isolation structure 702 in the first plane 11 is wider than the width of the isolation structure 702 in the second plane 21. A width Wc of the conductive member 310 in the first plane 11 is smaller than a width Wd of the conductive member 310 in the second plane 21 (Wc<Wd).

In the second example, the width of the isolation structure 702 in the first plane 11 is smaller than the width of the isolation structure 702 in the second plane 21. The width Wc of the conductive member 310 in the first plane 11 is greater than the width Wd of the conductive member 310 in the second plane 21 (Wc>Wd).

Figure 4A:
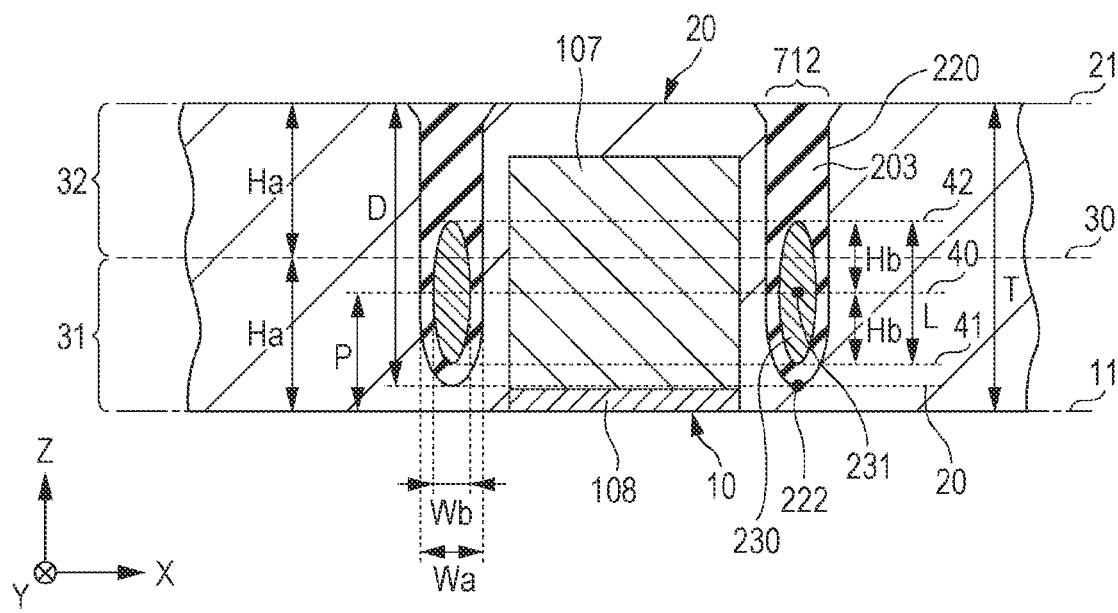
FIGS. 4A and 4B are schematic views for explaining an example of the semiconductor device.
Figure 4B:
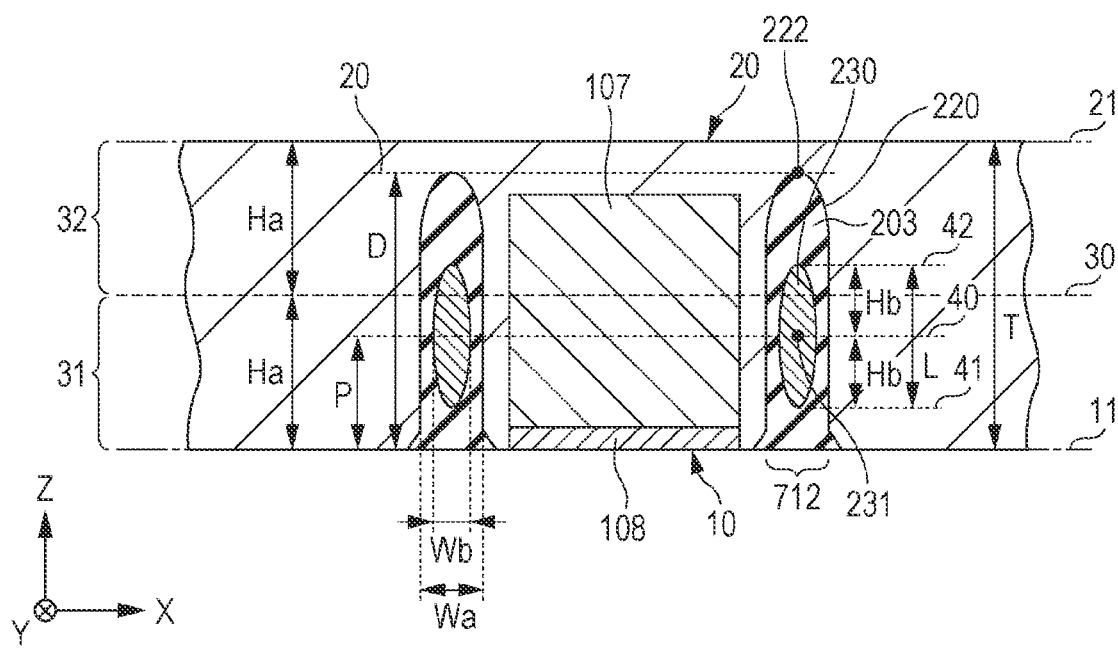

The position of the hollow part 230 in the isolation structure 712 will be described with reference to FIGS. 4A and 4B. FIG. 4A illustrates a first example of the isolation structure 712 and FIG. 4B illustrates a second example of the isolation structure 712.

The first plane 11, the second plane 21, and the intermediate plane 30 are similar to those described in FIGS. 3A and 3B, and hence description thereof will be omitted.

Not only the semiconductor layer 102 having the photoelectric conversion units 710 but also the solid material 203 and the hollow part 230 are positioned between the first plane 11 and the second plane 21. The solid material 203 and the hollow part 230 are arranged in the trench 220 provided in the semiconductor layer 102. The solid material 203 forms an interface with the hollow part 230. In the present example, the solid material 203 surrounds the hollow part 230. A state where the solid material 203 surrounds the hollow part 230 is provided when an entire interface between the hollow part 230 and a member around the hollow part 230 is formed by the solid material 203 and the hollow part 230. A state where the hollow part 230 forms the interface not only with the solid material 203 but also with the semiconductor layer 102 is not regarded as the surrounding state.

The trench 220 penetrates through the intermediate plane 30. In the first example (FIG. 4A), the trench 220 is connected to the back surface 20 and extends from the second plane 21 to penetrate through the intermediate plane 30. A bottom 222 of the trench 220 is positioned between the first plane 11 and the intermediate plane 30, that is, in the front-side region 31. In the second example (FIG. 4B), the trench 220 is connected to the front surface 10 and extends from the first plane 11 to penetrate through the intermediate plane 30. The bottom 222 of the trench 220 is positioned between the second plane 21 and the intermediate plane 30, that is, in the back-side region 32. Note that, the trench 220 may penetrate through the semiconductor layer 102. In this case, the trench 220 does not have the bottom 222. For example, the trench 220 may penetrate through the intermediate plane 30 from the first plane 11 and reach the second plane 21, or may penetrate through the intermediate plane 30 from the second plane 21 and reach the first plane 11.

The solid material 203 is provided at least between the second plane 21 and the intermediate plane 30, that is, in the back-side region 32. In the back-side region 32, the solid material 203 is provided between the conductive member 310 and the semiconductor layer 102. In the present example, a part of the solid material 203 is provided also between the first plane 11 and the intermediate plane 30, that is, in the front-side region 31. The solid material 203 is provided to extend from the back-side region 32 to the front-side region 31 along the side surface 120 of the semiconductor layer 102. The solid material 203 may be provided only between the second plane 21 and the third plane 30.

The hollow part 230 is provided at least between the first plane 11 and the intermediate plane 30, that is, in the front-side region 31. In the present example, a part of the hollow part 230 is provided also between the second plane 21 and the intermediate plane 30, that is, in the back-side region 32. The hollow part 230 may be provided only between the first plane 11 and the third plane 30. The hollow part 230 is provided to extend from the front-side region 31 to the back-side region 32 along the side surface 120 of the semiconductor layer 102.

A center 231 of the hollow part 230 in the thickness direction Z is positioned between the first plane 11 and the intermediate plane 30, that is, in the front-side region 31. The center 231 of the hollow part 230 is at a position 40 at an equal distance Hb from a position 41 of an end of the hollow part 230 on the first plane 11 side and a position 42 of an end of the hollow part 230 on the second plane 21 side. The distance Hb corresponds to a half of a length L of the hollow part 230 in the thickness direction Z (Hb=L/2). A distance P between the center 231 and the first plane 11 is shorter than the distance Ha (Ha>P). The distance P is desired to be longer than the distance Hb (P>Hb). When the hollow part 230 penetrates through the first plane 11 and extends to the side opposite to the semiconductor layer 102 with respect to the first plane 11, the distance P may be shorter than the distance Hb. In both of the examples of FIGS. 4A and 4B, the distance between the second plane 21 and the position 42 of the end of the hollow part 230 on the second plane 21 side is longer than the distance between the first plane 11 and the position 41 of the end of the hollow part 230 on the first plane 11 side.

A distance Wa between the conductive member 310 and the semiconductor layer 102 in the in-plane direction X is desired to be greater than a width Wb of the hollow part 230 in the in-plane direction X. When the hollow part 230 is surrounded by the solid material 203, the width Wb of the hollow part 230 may be smaller than the distance Wa. For enhancing stress-relaxing properties, it is desired that the width Wb of the hollow part 230 is as wide as possible and the width Wb is greater than a half of the distance Wa (Wb>Wa/2).

The distance between the hollow part 130 and the conductive member 310 may be shorter than the distance between the hollow part 130 and the semiconductor layer 102. The distance between the hollow part 130 and the conductive member 310 corresponds to the thickness of the solid material 103 positioned between the hollow part 130 and the conductive member 310. The distance between the hollow part 130 and the semiconductor layer 102 corresponds to the thickness of the solid material 103 positioned between the hollow part 130 and the semiconductor layer 102.

A difference between the first example (FIG. 4A) and the second example (FIG. 4B) lies in that a relation of a width of the isolation structure 712 and a width of the conductive member 310 in the in-plane direction X is different in the thickness direction Z.

In the first example, the width of the isolation structure 712 in the second plane 21 is greater than the width of the isolation structure 712 in the third plane 30. When the trench 220 penetrates through the semiconductor layer 102, the width of the isolation structure 712 in the second plane 21 is greater than the width of the isolation structure 712 in the first plane 11.

In the second example, the width of the isolation structure 712 in the first plane 11 is greater than the width of the isolation structure 712 in the third plane 30. When the trench 220 penetrates through the semiconductor layer 102, the width of the isolation structure 712 in the first plane 11 is greater than the width of the isolation structure 712 in the second plane 21.

As described above, the center 131 of the hollow part 130 is positioned in the front-side region 31 in the isolation structure 702 and the center 231 of the hollow part 230 is positioned in the front-side region 31 in the isolation structure 712. By setting each of the center 131 of the hollow part 130 and the center 231 of the hollow part 230 in the front-side region 31, it is possible to improve the reliability of the semiconductor device 500. A reason therefor will be described below.

A conductive material (for example, copper) that forms the conductive member 310 penetrating through the semiconductor layer 102 has a different thermal expansion coefficient from that of the semiconductor layer 102. Therefore, strain stress is accumulated between the semiconductor layer 102 and the conductive member 310 due to the difference of an amount of thermal expansion. The strain stress accumulated in this manner causes mechanical damages to a part in which the conductive member 310 is bonded to the interconnect layer 110 or the pad electrode 311, which is connected to the conductive member 310, or to the conductive member 310 itself.

The solid material 203 in the trench 220 may also have a different thermal expansion coefficient from that of the semiconductor layer 102. The element isolation unit 104 formed on the front surface 10 of the semiconductor layer 102 also has a different thermal expansion coefficient from that of the semiconductor layer 102. A gate electrode of the transistor or the like also has a different thermal expansion coefficient from that of the semiconductor layer 102. The interconnect layers 110, 112, and 114, the plugs 109, 111, and 113, and the insulating film 117 of the interconnect structure 150 also have a different thermal expansion coefficient from that of the semiconductor layer 102. Therefore, strain stress is accumulated between the semiconductor layer 102 and the members around the semiconductor layer 102 due to the difference of an amount of thermal expansion. The strain stress accumulated in this manner causes mechanical damages to the members around the semiconductor layer 102. A region in the semiconductor layer 102, in which the strain stress is inherent, has problems of changing current-voltage characteristics of the transistor or generating leak current or the like, for example. The change in the characteristics and the leak current in an image capturing device are problems directly connected to image quality.

Against such problems, it is possible to reduce the stress due to the difference of thermal expansion by providing the hollow part 130 or 230. This is because a hollow space is able to absorb or buffer the expansion of the semiconductor layer 102 or the expansion of the conductive member 310 and other members. That is, by providing the hollow part 130 or 230, it is possible to solve or reduce various problems caused by the stress as described above.

On the other hand, when a large part of the hollow part 130 or 230 is provided in a large part between the first plane 11 and the second plane 21, strength of the isolation structure 702 or 712 itself is lowered. For example, when a mechanical impact from the second plane 21 side, a sharp rise in temperature, or deflection of the semiconductor layer 102 is generated in the semiconductor layer 102, the hollow part 130 or 230 is crushed and the solid material 103 or 203 is damaged or broken. Then, there is a possibility that abnormal stress is generated to cause damage, or electrical or optical isolation performance is deteriorated.

Against such a new problem caused by providing the hollow part 130 or 230, by setting the center 131 or 231 of the hollow part 130 or 230 in the front-side region 31, lowering of the strength of the isolation structure 702 or 712 itself as described above is able to be prevented. That is, a proportion of a part positioned at the back-side region 32 in the hollow part 130 or 230 is set to be half or less (may be zero) and the solid material 103 or 203 is arranged in the back-side region 32. Thereby, while the stress is reduced by arranging the hollow part 130 or 230 in the front-side region 31 which is significantly influenced by the problem due to the stress, the proportion of the hollow part 130 or 230 is reduced in the back-side region 32, so that the mechanical strength of the semiconductor device 500 is able to be ensured. As a result, it is possible to improve the reliability of the semiconductor device 500.

Next, a method for manufacturing a semiconductor device will be described.

Figure 5A:
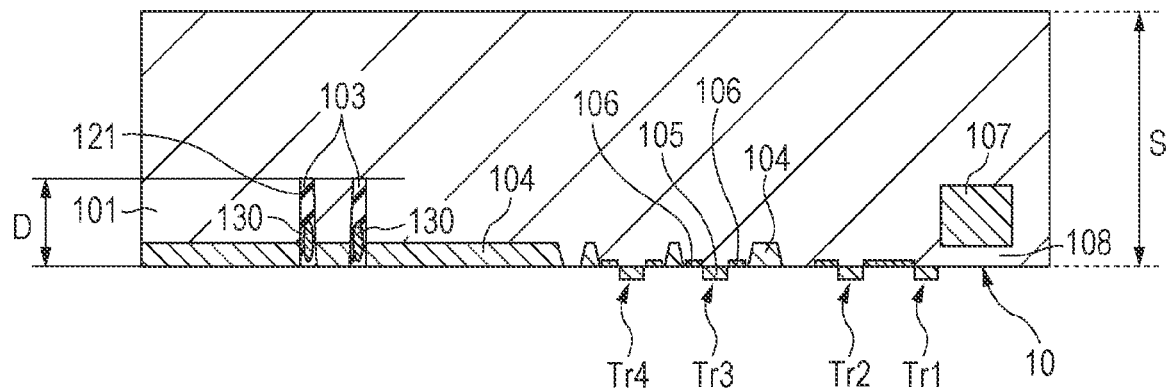
FIGS. 5A to 5E are schematic views for explaining an example of a method for manufacturing the semiconductor device.

First, as illustrated in FIG. 5A, the element isolation unit 104 is formed on the front surface 10 side of a semiconductor substrate 101 having a thickness S. The element isolation unit 104 may have a LOCO structure or a STI structure. In the present example, the element isolation unit 104 has the STI structure. Note that, the thickness S may be about 500 to 1000 μm. The thickness S of the semiconductor substrate 101 at this time is significantly greater than the thickness T of the semiconductor layer 102 obtained by thinning the semiconductor substrate 101 (for example, the thickness S is 10 to 1000 times the thickness T).

Moreover, the N-type semiconductor region 107 constituting the photodiode is formed. The pixel transistors Tr1 and Tr2 and the peripheral transistors Tr3 and Tr4 each of which has the gate electrode 105 and the source/drain region 106 are formed.

In addition, a trench 121 having a bottom at a position deeper than the element isolation unit 104 is formed in a substrate depth direction of the semiconductor substrate 101. A depth D of the trench 121 may be smaller than the thickness S of the semiconductor substrate 101. Since the thickness S of the semiconductor substrate 101 is large, it is not efficient that the trench 121 penetrates through the semiconductor substrate 101. The trench 121 is able to be formed by forming an insulating layer for protection (not illustrated) on the front surface 10 of the semiconductor substrate 101, on which the gate electrodes 105 are formed, and then performing etching for the semiconductor substrate 101 from the front surface 10 side. The trench 121 is able to be formed so as to surround a part of the semiconductor substrate 101, in which the conductive member 310 is to be arranged in the following step.

Further, the solid material 103 that is the insulator is formed in the trench 121. The solid material 103 is able to be formed by forming a film of an insulating material with use of a CVD method or the like to fill the resultant in the trench 121 and removing the insulating material positioned outside the trench 121 by means of etching, a CMP method, or the like. The solid material 103 is formed in a region surrounding the conductive member 310 to be formed in the following step. At this time, the hollow part 130 is provided in a part of the trench 121. Therefore, a depth and a width of the trench 121, a type or a film formation condition of the material to be filled are able to be optionally decided in consideration of, for example, a deposition speed and a filled shape of the material to be filled. The position of the hollow part 130 is set so that the center 131 described in FIGS. 3A and 3B is to be positioned in the front-side region 31 later. Typically, a distance between the center 131 of the hollow part 130 and the bottom of the trench 121 may be set to be greater than a half of the depth D of the trench 121.

Figure 5B:
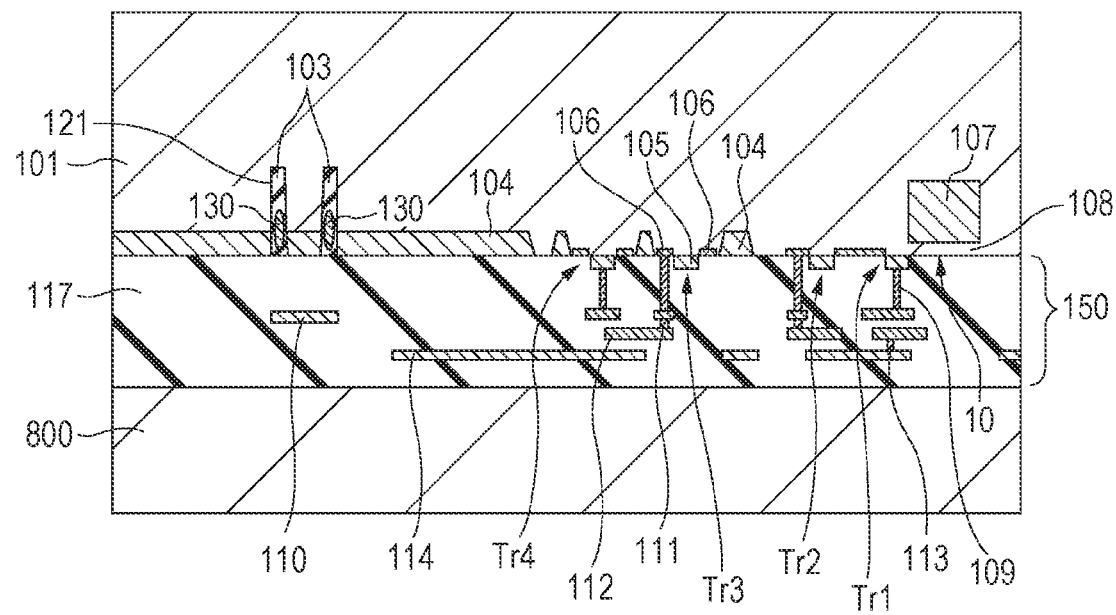

Next, as illustrated in FIG. 5B, an interlayer insulating layer is formed on the front surface of the semiconductor layer 102, a connection hole is then formed in the interlayer insulating layer, and the plug 109 to be connected to a desired transistor is formed. The plug 109 is able to be formed of tungsten.

Further, the interconnect structure 150 is formed by forming the plurality of interconnect layers 110, 112, and 114 through the interlayer insulating layer for connection to the plug 109. The interconnect layers 110, 112, and 114 are able to be formed by using copper wiring with a damascene method. The plugs 111 and 113 are able to be formed of copper with a dual damascene method. The passivation layer is formed to cover the interconnect layer 114. The passivation layer is desired to be selected from materials having lower moisture permeability than that of the material mainly forming the interlayer insulating layer, and a silicon nitride layer or a silicon oxide nitride layer, for example, is able to be formed with a CVD method.

Then, the supporting substrate 800 is bonded to the interconnect structure 150. Note that, the passivation layer or an underlying layer may be subjected to planarization processing or a planarized layer may be formed on the passivation layer as necessary. Thereby, an interface to which the supporting substrate 800 is bonded is able to be planarized, and this is advantageous for increasing strength of bonding.

Figure 5C:
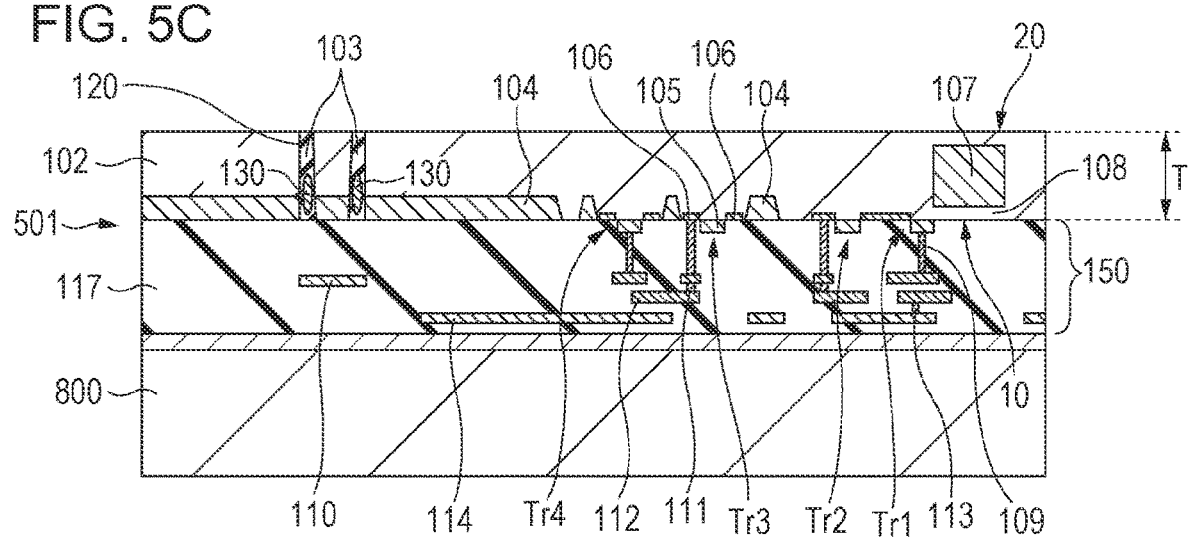

Next, as illustrated in FIG. 5C, the semiconductor substrate 101 is cut and ground from the side opposite to the front surface 10 thereof to make the semiconductor substrate 101 thin (thinning step). As a result, the semiconductor layer 102 having the thickness T is obtained from the semiconductor substrate 101 having the thickness S. The surface opposite to the front surface 10 is the back surface 20. The thinning step is performed at least until the surface opposite to the front surface 10 reaches the bottom of the trench 121. That is, at least a part with a thickness (S−D) corresponding to a difference between the thickness S and the depth D is removed from the semiconductor substrate 101. A more part is also able to be removed. The thinning is desired to be performed so that the solid material 103 is exposed to the side opposite to the front surface 10. This makes it possible to improve performance of insulating the conductive member 310 and the semiconductor layer 102 by the solid material 103. Further, it is desired that the thinning is performed so that the hollow part 130 is not exposed to the side opposite to the front surface 10. As described above, when the center of the hollow part 130 is arranged to be closer to the front surface 10 side than the half of the depth D of the trench 121, it is possible to reduce possibility that the hollow part 130 is exposed to the side opposite to the front surface 10.

After the thinning, a P-type semiconductor region (not illustrated) for suppressing dark current is formed on the back surface 20 side of the photodiode. While the thickness of the semiconductor substrate 101 before the thinning is, for example, about 600 μm, the thickness of the semiconductor layer 102 obtained after the thinning is, for example, about 1 to 10 μm. Thereby, electric charges generated by light incident through the back surface 20 are easily processed by the transistors on the front surface 10 side.

Figure 5D:
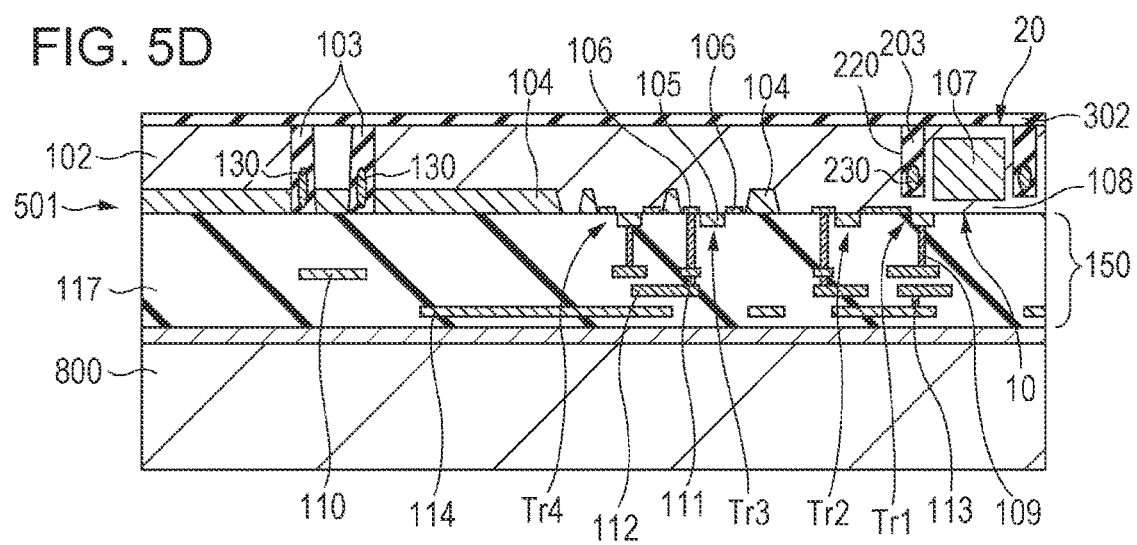

Next, as illustrated in FIG. 5D, the trench 220 is formed in the semiconductor layer 102 from the back surface 20 side. The solid material 203 is further formed in the trench 220. A film formation condition of the solid material 203 and a shape of the trench 220 are set so that the hollow part 230 is formed in the trench 220. As described with reference to FIG. 4A, the center 231 of the hollow part 230 is desired to be positioned in the front-side region 31.

Then, the insulating layer 302 is formed on the back surface 20 of the semiconductor layer 102. The insulating layer 302 may be formed so as to cover the solid materials 103 and 203. The trench 220 and the solid material 203 may be formed after forming the insulating layer 302.

Figure 5E:
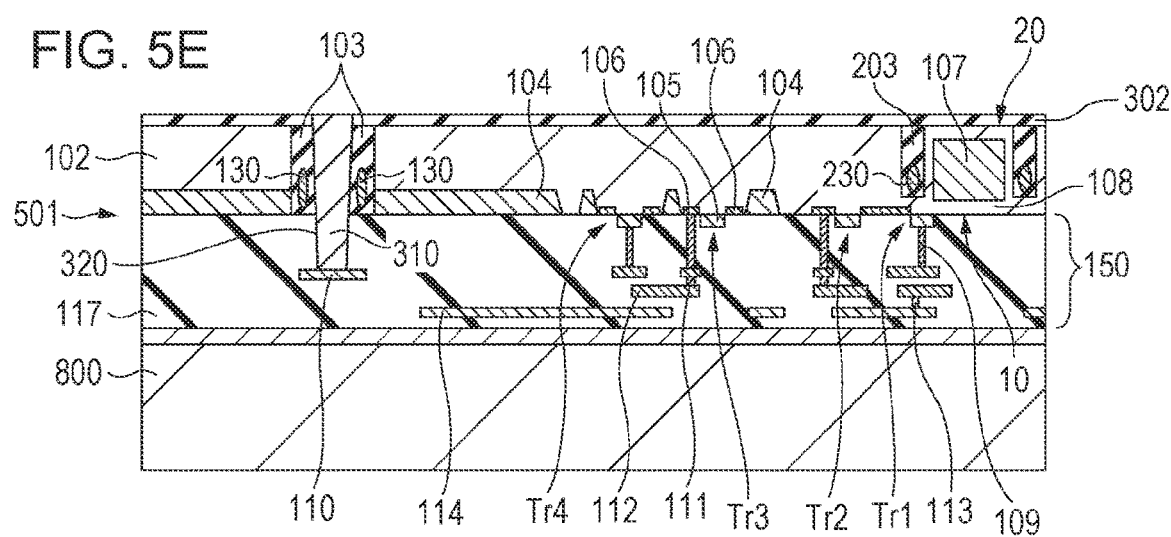

Next, as illustrated in FIG. 5E, a hole 320 reaching the interconnect layer 110 is formed from the back surface 20 side of the semiconductor layer 102. Note that, the hole 320 has a width of, for example, 1 to 5 μm and a depth of, for example, 5 to 15 μm. The hole 320 is able to be formed so as to remove a part of the semiconductor substrate 101, which is surrounded by the trench 121 at the previous step. At this time, the solid material 103 is able to be used as an etching guide ring for forming the hole 320. That is, the hole 320 is formed so that the solid material 103 forms a side surface of the hole 320. As the solid material 103 used as the etching guide ring, for example, silicon oxide which allows an etching rate for the semiconductor layer 102 to be reduced easily is able to be suitably used. When the solid material 103 is used as the etching guide ring, a part of the solid material 103 on the back surface 20 side is subjected to etching for a longer time. By making the center of the hollow part 130 closer to the front surface 10 than the back surface 20 and increasing a proportion of the solid material 103 positioned on the back surface 20 side, it is possible to enhance durability as the etching guide ring. Further, by forming the trench 121 from the front surface 10 side, the trench 121 achieves a tapered shape in which the width of the trench 121 becomes narrower as advancing to the bottom of the trench 121. Such a tapered shape is advantageous, when forming the hole 320, for achieving a shape of the hole 320 becoming narrower as advancing to the front surface 10. When the hole 320 has the shape becoming narrower as advancing to the front surface 10, the conductive material is easily filled in the hole 320 when the conductive member 310 is formed. Note that, when the solid material 103 is used as the etching guide ring, a part of the solid material 103 on the hole 320 side may be thinner than a part of the solid material 103 on the semiconductor layer 102 side. As a result, a distance between the hollow part 130 and the conductive member 310 may be shorter than a distance between the hollow part 130 and the semiconductor layer 102.

Note that, it is also possible to prevent the solid material 103 or the hollow part 130 from being exposed to the hole 320 by setting the width of the hole 320 to be smaller than an inner diameter of the isolation structure formed by the solid material 103.

Subsequently, the conductive member 310 is formed in the hole 320. As the conductive member 310, a metal material, for example, such as copper or tungsten is able to be used. Note that, the solid material 103 is positioned between the semiconductor layer 102 through which the conductive member 310 penetrates and the conductive member 310. It is possible to improve performance of insulating the conductive member 310 and the semiconductor layer 102 (silicon layer) by the solid material 103. In this manner, the conductive member 310 is formed after thinning the semiconductor substrate 101. This makes it possible to reduce an aspect ratio of the conductive member 310. When the hollow part 130 is prevented from being exposed to the side opposite to the front surface 10 at the thinning step, the reliability of insulating isolation between the conductive member 310 and the semiconductor layer 102 is able to be enhanced. That is, when the hollow part 130 is exposed to the side opposite to the front surface 10, the conductive material enters the hollow part 130 at a time of forming a film of the conductive material for the conductive member 310. Then, the conductive material makes contact with the semiconductor layer 102 and breakdown voltage is reduced by the thin solid material 103. Such problems are able to be avoided when the hollow part 130 is not exposed to the back surface 20 side and is covered with the solid material 103.

Figure 2:
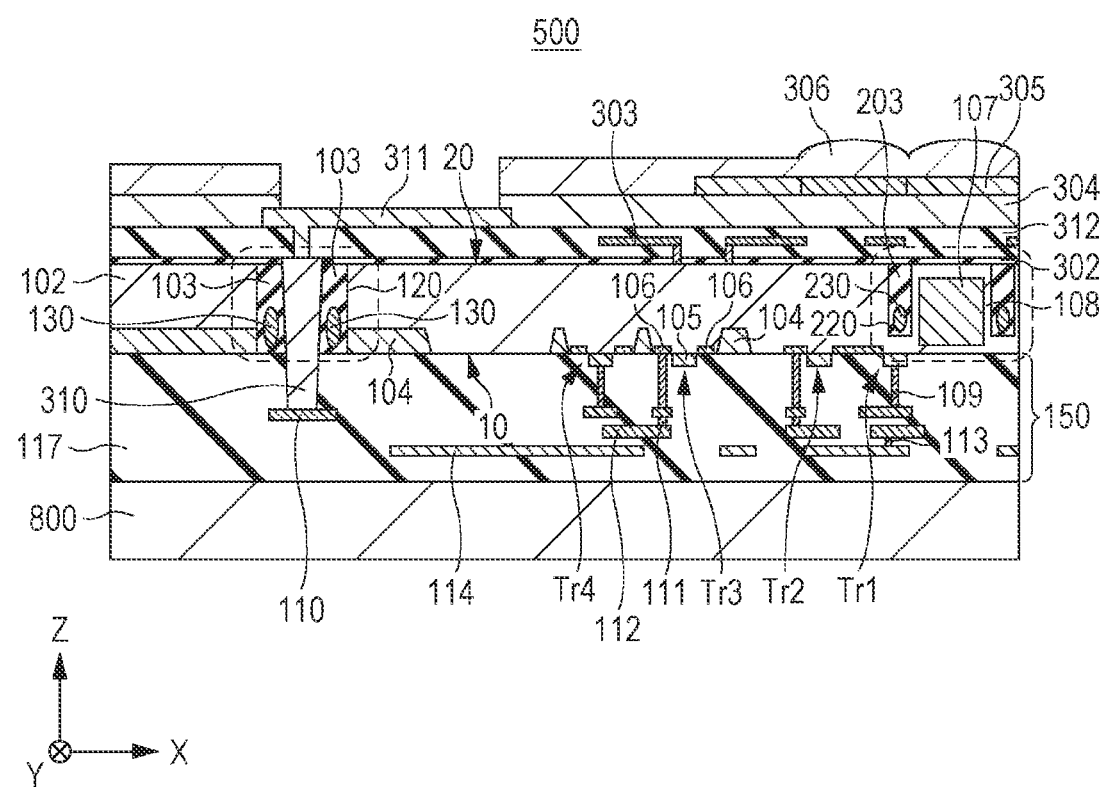
FIG. 2 is a schematic view for explaining an example of the semiconductor device.

Then, as illustrated in FIG. 2, the light shielding layer 303 and the insulating layer 312 for protection are formed on the back surface 20. Thereafter, a connection hole is formed in the insulating layer 312 so as to cover the light shielding layer 303 as illustrated in FIG. 2. After the connection hole is formed, the pad electrode 311 having a barrier metal layer/an aluminum layer is formed. Then, the planarized layer 304 is formed. The color filter array 305, for example, in red, green, and blue is formed on the planarized layer 304 correspondingly to pixels, and the lens array 306 is formed thereon. Note that, an opening is formed on a layer of the pad electrode 311 so that the pad electrode 311 is exposed after the planarized layer 304, the color filter array 305, and the lens array 306 are formed.

An example in which the isolation structure 712 is formed from the back surface 20 side of the semiconductor layer 102 obtained by thinning the semiconductor substrate 101 and the conductive member 310 is then formed from the back surface 20 side has been described. However, the conductive member 310 may be formed from the back surface 20 side of the semiconductor layer 102 after the semiconductor substrate 101 is thinned and then the isolation structure 712 may be formed from the back surface 20 side. Moreover, the isolation structure 712 may be formed from the front surface 10 side of the semiconductor substrate 101 before the semiconductor substrate 101 is thinned or the isolation structure 702 and the isolation structure 712 may be formed simultaneously.

Though the exemplary embodiment of the semiconductor device has been described by taking an image capturing device as an example, the exemplary embodiment is applicable to a semiconductor device used as an arithmetic device, a storage device, a communication device, or a display device other than the image capturing device. The foregoing exemplary embodiment may be modified as appropriate without departing from the concept of the invention.

According to the invention, a semiconductor device having high reliability is able to be provided.

According to the invention, a method for manufacturing the semiconductor device having high reliability is able to be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A semiconductor device comprising:
   a semiconductor layer having a front surface on which a transistor is provided and a back surface opposite to the front surface; and
   a conductive member that penetrates through the semiconductor layer, wherein
   a virtual plane that includes the front surface and extends along the front surface is set as a first plane, a virtual plane that includes the back surface and extends along the back surface is set as a second plane, and a virtual plane that is positioned at an equal distance from the first plane and the second plane is set as a third plane,
   between the second plane and the third plane, a solid material that is an insulator is provided between the conductive member and the semiconductor layer,
   between the first plane and the third plane, a hollow part is provided between the conductive member and the semiconductor layer, and
   a center of the hollow part in a direction crossing the first plane and the second plane is positioned between the first plane and the third plane,
   wherein a width of the conductive member in the first plane is narrower than a width of the conductive member in the second plane.

2. The semiconductor device according to claim 1, wherein a distance between the hollow part and the conductive member is shorter than a distance between the hollow part and the semiconductor layer.

3. The semiconductor device according to claim 1, wherein a part of the hollow part is positioned between the second plane and the third plane.

4. The semiconductor device according to claim 1, wherein at least a part of the solid material is positioned between the first plane and the third plane.

5. The semiconductor device according to claim 1, wherein the solid material surrounds the hollow part.

6. The semiconductor device according to claim 1, wherein a distance between the second plane and an end of the hollow part on a second plane side is longer than a distance between the first plane and an end of the hollow part on a first plane side.

7. The semiconductor device according to claim 1, wherein the solid material contacts the conductive member and the semiconductor layer.

8. A semiconductor device comprising a semiconductor layer that has a front surface on which a transistor is provided and a back surface opposite to the front surface, wherein
a virtual plane that includes the front surface and extends along the front surface is set as a first plane, a virtual plane that includes the back surface and extends along the back surface is set as a second plane, and a virtual plane that is positioned at an equal distance from the first plane and the second plane is set as a third plane,
a trench penetrating through the third plane is arranged in the semiconductor layer,
a hollow part is arranged in the trench,
a solid material including a layer is arranged in the trench,
a center of the hollow part in a direction crossing the first plane and the second plane is positioned between the first plane and the third plane, and a distance between the center of the hollow part and the first plane is greater than a half of a length of the hollow part in the direction, and
the layer of the solid material extends from the second plane to a position between the third plane and the first plane and is arranged between the hollow part and the semiconductor layer.

9. The semiconductor device according to claim 8, wherein the trench penetrates through the semiconductor layer.

10. The semiconductor device according to claim 8, wherein the trench has a bottom between the first plane and the third plane.

11. The semiconductor device according to claim 8, wherein the semiconductor layer includes a plurality of photoelectric conversion units each of which is positioned between the first plane and the second plane, and the trench is provided between the plurality of photoelectric conversion units.

12. The semiconductor device according to claim 8, wherein a part of the hollow part is positioned between the second plane and the third plane.

13. The semiconductor device according to claim 8, wherein at least a part of the solid material is positioned between the first plane and the third plane.

14. The semiconductor device according to claim 8, wherein the solid material surrounds the hollow part.

15. The semiconductor device according to claim 8, wherein a distance between the second plane and an end of the hollow part on a second plane side is longer than a distance between the first plane and an end of the hollow part on a first plane side.

16. The semiconductor device according to claim 8, further comprising:
a conductive material arranged in a hole in the semiconductor layer,
wherein the trench is arranged between the semiconductor layer and the conductive material.

17. The semiconductor device according to claim 16, wherein the solid material contacts the conductive member and the semiconductor layer.

18. The semiconductor device according to claim 16, wherein a width of the conductive member in the first plane is narrower than a width of the conductive member in the second plane.

19. The semiconductor device according to claim 8, wherein
the layer extends to the first plane.

20. A method for manufacturing a semiconductor device, the method comprising the steps of:
forming, from a front surface side of a semiconductor substrate, a trench in the semiconductor substrate;
forming a solid material, which is an insulator, in the trench;
thinning the semiconductor substrate from a side opposite to the front surface,
after the thinning the semiconductor substrate, forming a hole by removing a part of the semiconductor substrate surrounded by the trench, and
after the forming the hole, forming a conductive member in the hole,
wherein
the forming the solid material is performed so that a hollow part is formed in the trench, and
a distance between a center of the hollow part and a bottom of the trench in a depth direction of the trench is greater than a half of a depth of the trench.

21. The method for manufacturing the semiconductor device according to claim 20, wherein the thinning the semiconductor substrate is performed in a manner such that the hollow part is not exposed to the opposite side.

22. The method for manufacturing the semiconductor device according to claim 20, wherein the forming the hole is performed in a manner such that at least a part of the solid material is arranged between a side surface of the hole and the semiconductor substrate.

23. The method for manufacturing the semiconductor device according to claim 20, wherein the forming the trench is performed in a manner such that a width of the trench becomes narrower as advancing to a bottom of the trench.

24. The method for manufacturing the semiconductor device according to claim 20, wherein the solid material contacts the conductive member and the semiconductor layer.

* * * * *